METHOD AND APPARATUS FOR SEMICONDUCTOR WAFER HANDLING

Filed Sept. 25, 1964 2 Sheets-Sheet 1

INVENTORS
Theodore Patrick, Peter E. Pflaumer
& John W. Philbrick
BY Gordon H Telfer
ATTORNEY United States Patent Office 3,272,350

Patented Sept. 13, 1966

3,272,350

METHOD AND APPARATUS FOR SEMICONDUCTOR WAFER HANDLING

Peter E. Pflaumer, Catonsville, Baltimore, and Theodore Patrick, Ellicott City, Md., and John W. Philbrick, Pittsburgh, Pa., assignors to Westinghouse Electric Corporation, East Pittsburgh, Pa., a corporation of Pennsylvania Filed Sept. 25, 1964, Ser. No. 399,200
7 Claims. (Cl. 214—1)

This invention relates generally to semiconductor devices and their fabrication and, more particularly, to a method and apparatus for the handling of semiconductor wafers during device fabrication.

It is the practice in semiconductor integrated circuit fabrication, and the fabrication of other semiconductor devices as well, to use as the starting material a wafer having major surfaces as large as is conveniently available. Typically, wafers having a diameter of from about one-half inch to about one and one-half inches are used. Several hundred individual integrated circuits, or other devices, may be made on a single starting wafer. They are usually separated subsequent to the fabrication operations and individually packaged. The use of a large starting wafer to fabricate a large number of integrated circuits is a great convenience and cost saver. However, it is presently the case that the starting wafer is handled manually by tweezers between operations. The tweezer handling occurs many times, particularly because the semiconductor integrated circuits are formed by several different photoresist operations with wafer transfers required between work stations for each of the operations wherein the photoresist material is applied, the optical mask is disposed on the wafer, the photoresist material is exposed, developed, etching is performed and the photoresist material is removed.

In all of these steps in which the operator presently uses tweezers to position the wafers, the possibility of wafer damage exists. The wafer may be broken, scratched by the tweezers or contaminated by impurities on the tweezers themselves that are transferred to the wafer. It is also possible to induce wafer damage as a result of strain induced by the locally high pressure put on the wafer by the sharp tweezers.

Furthermore, the tweezer handling technique is quite slow because each wafer must be handled individually and considerable operator time is required merely for wafer handling as opposed to the time available for productive work on the wafer itself.

It is, therefore, an object of the present invention to provide an improved method and apparatus for the safe, clean and rapid handling of a workpiece that is relatively fragile and susceptible to contamination such as a semiconductor wafer.

Another object is to provide a wafer carrier for rapidly handling a plurality of semiconductor wafers, particularly for semiconductor integrated circuit fabrication, without breakage or contamination.

Another object is to provide apparatus for handling semiconductor wafers that is suitable for a mechanized wafer handling operation.

Another object is to provide a method for fabricating semiconductor devices, such as integrated circuits, wherein a plurality of semiconductor wafers are simultaneously transported from a first work station and disposed in proper position in a second work station.

The foregoing and additional objects and advantages of the invention are achieved by the present invention that provides, in its preferred form, a wafer handling device or carrier of a generally flat rigid member having opposed major surfaces and an edge surface extending therebetween. A plurality of recesses are in one of the major surfaces for receiving and retaining a like plurality of semiconductor wafers and, additionally, there are a plurality of slots through the member extending from the edge to the recesses. The slots are mutually parallel and the recesses regularly disposed so that the carrier may be positioned about a like plurality of vacuum chucks and the wafers transferred from the holder to the vacuum chucks simultaneously. Subsequent to performance of an operation on the wafers the holder may be reinserted around the vacuum chucks and the wafers simultaneously removed and transferred to another work station.

The apparatus in accordance with this invention is particularly useful in the performance of the various photoresist operations that are conventionally performed on vacuum chucks but presently require individual loading of wafers by tweezers. These include the operations of applying and spinning the photoresist material, aligning the optical mask by which the desired pattern of photoresist material is formed, developing the photoresist material, etching the material exposed through the photoresist pattern and stripping the photoresist material from the semiconductor wafer. However, it will be appreciated that through careful selection of the materials of which the magazine is made it is possible to employ the same holder throughout the fabrication operation including the impurity diffusion and epitaxial growth operations to which the device is subjected.

It is also the case that while wafer holders in accordance with this invention are advantageously used for the manual handling of a plurality of wafers, wafer carriers in accordance with this invention are suitable for automated handling since the wafer carrier may be disposed in a mechanical apparatus which will effect removal of the wafers from one vacuum chuck station and transfer them to another.

The present invention together with the above-mentioned and additional objects and advantages thereof will be better understood by reference to the following description, taken in connection with the acompanying drawing, wherein:

FIGURES 1A and 1B are views of a single wafer carrier in accordance with the present invention wherein FIG. 1A is a plan view and FIG. 1B is an elevation view, partly in section;

FIG. 2 is a partial plan view of an alternative form of the present invention;

FIGS. 3A to 3C are views of an alternative form of the present invention wherein FIG. 3A is a plan view, FIG. 3B is an elevation view and FIG. 3C is a partial sectional view taken along the line IV—IV of FIG. 3A;

FIG. 4 is a sectional view of a cover suitable for use with the wafer carrier illustrated in FIGS. 3A to 3C.

Figures 1A, 1B, 3B, 4:
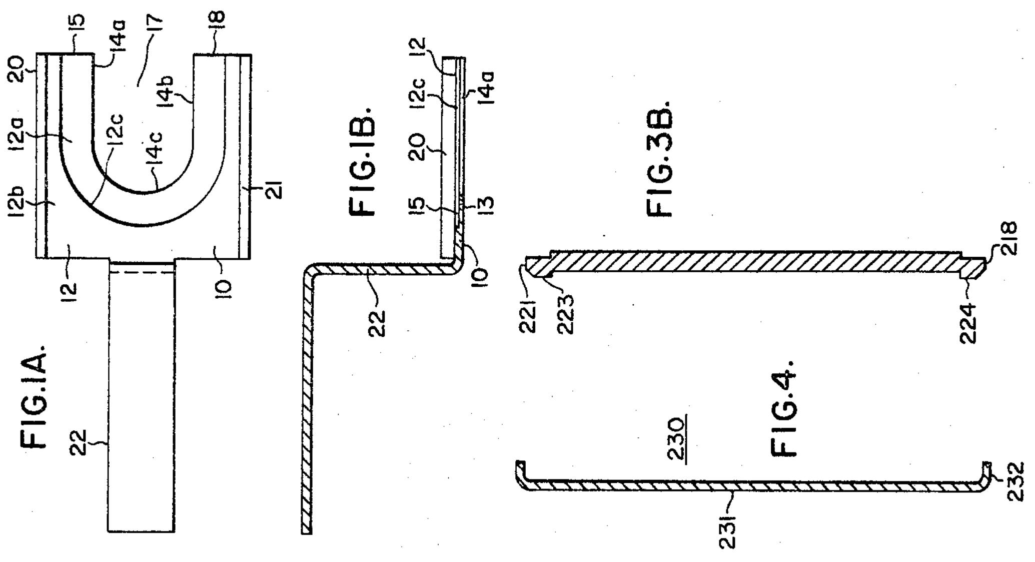

Referring to FIGS. 1A and 1B, a carrier for a single wafer is illustrated comprising a generally flat, rigid member 10 having opposed major surfaces 12 and 13 with a recess 15 in one of the major surfaces for receiving and retaining a semiconductor wafer. A slot 17 through the member 10 extends from one edge 18 so that the member can be positioned about a work station such as a vacuum chuck and a wafer can be transferred between the work station and the carrier.

The term "recess" as used herein means an indentation defined by a first surface portion that is displaced from a second surface portion that at least partially surrounds it. For example, in FIGS. 1A and 1B, the recess 15 is defined by a first surface portion 12a that is partially surrounded by a second surface portion 12*b*. A third surface portion 12*c* joins the portions 12*a* and 12*b* and provides means to retain a wafer on the portion 12*a*. The term "slot" as used herein means an opening in a member defined by first and second side surface portions and an end surface portion joining the first and second surface portions. For example, in FIGS. 1A and 1B, the slot 17 is defined by side surface portions 14*a* and 14*b* that are joined by end surface 14*c*. The usage of the terms "recess" and "slot" as just explained is believed to be as the terms are commonly understood. For clarity, no further specific reference is made to the surface portions that define the recesses and slots referred to in the ensuing description and claims.

The member 10 also has walls 20 and 21 extending from the surface 12 to provide a support for a cover (not shown) that may be placed on the carrier to protect a wafer between work operations.

In the embodiment illustrated in FIGS. 1A and 1B, a handle 22 is provided having a 90° bend that is attached at a 90° angle to the member 10.

While a single wafer carrier provides distinct advantages in reducing damage and contamination of wafers, it is much preferred to use a carrier to handle a plurality of wafers.

Figures 2, 3C:
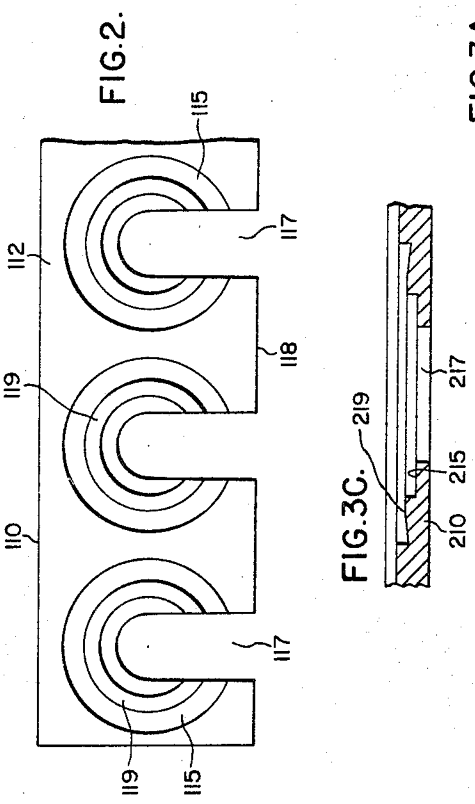

FIG. 2 illustrates a carrier in which a plurality of wafers may be carried. The carrier of FIG. 2 comprises a generally flat member 110 having a plurality of recesses 115 in one of its major surfaces 112 extending in a row with a slot 117 from one edge 118 to each of the recesses 115. Also in this configuration a ridge 119 is provided within the recess so as to minimize contact between the wafers and the carrier. The regularly disposed recesses and slots are so designed as to fit around a like plurality of similarly arranged workpiece holders such as vacuum chucks so that a plurality of carriers can be simultaneously disposed on the vacuum chucks.

While only three wafer holding recesses 115 are shown in FIG. 2 of the carrier it may be extended as desired to include additional recesses for additional wafers.

Figure 3A:
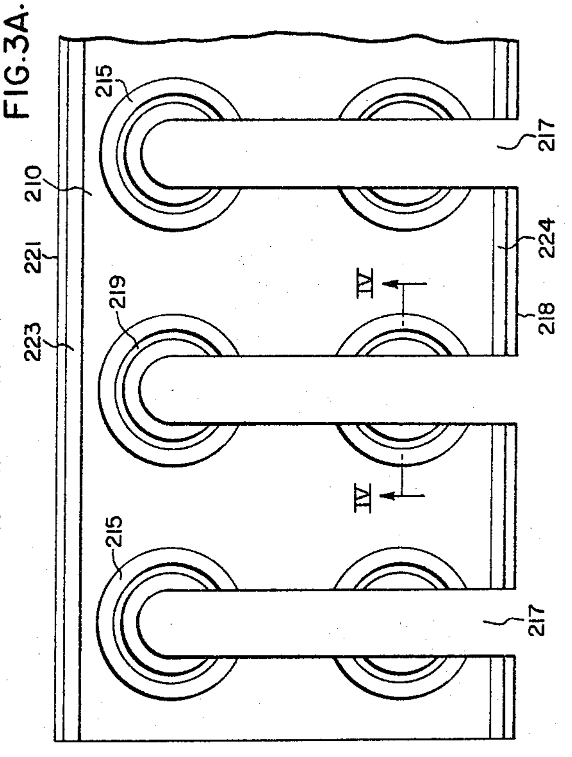

FIGS. 3A, 3B and 3C illustrate another embodiment of a wafer carrier in accordance with the invention. Here, two rows of recesses 215 are provided in a single member 210 with slots 217 from one edge 218 communicating with a recess in each of the rows. Otherwise, the general configuration is similar to that of FIG. 2. Notches (not shown) may be provided in the back edge 221 of the carrier are for the purpose of permitting rapid position indexing of the wafer carrier by means of an indent system for automatic feeding of machinery or apparatus.

The side view of FIG. 3B illustrates the configuration including a ridge 223 along the back edge 221 of the carrier and a similar ridge 224 on the leading edge 218. Each ridge 223 and 224 has a 45° chamfer. The ridges 223 and 224 are for the purposes of holding a cover for the carrier. The chamfer is to prevent the carrier from binding in the radius of a bent sheet metal trough such as might be used as machine loading chute.

FIG. 3C further illustrates the ridge 219 within each of the recesses 215.

The embodiments of FIGS. 2 and 3 do not have a handle such as the element 22 of FIGS. 1A and 1B. They may be conveniently handled merely by grasping at the edge. Of course, some means for otherwise handling the carriers may be provided.

FIG. 4 illustrates a cover 230 for a carrier as shown in FIGS. 3A to 3C comprising a flat top portion 231 and side portions 232. The cover 230 may be of the same material as the carrier member 210 and is used whenever it is desired to protect wafers between operations by positioning it so that the sides 232 extend over the ridges 223 and 224 of the carrier. The cover 230 is preferably opaque so it can prevent undesired exposure of photoresist material.

Carriers as illustrated have been fabricated of anodized aluminum but, of course, other materials such as plastics or passivated metals could be used where acid resistance or other special requirements dictate. The carriers have been formed by machining but they may also be formed by punching, casting or other means. Anodized aluminum carriers have been made from sheets having a thickness of about ⅛ inch with the recesses within the carriers having centers spaced 1.7 inches apart, the outer diameter of the recesses being about 1.35 inches and the slots being ½-inch wide. Carriers capable of simultaneously handling up to 18 wafers, having a double row of recesses with nine recesses in a row, have been successfully made and used. Carriers for a larger number of wafers may, of course, be provided in accordance with this invention.

Wafer carriers in accordance with the present invention are useful with vacuum chucks of conventional types, that is, those generally comprising a cylindrical member through which a vacuum is continuously drawn so that upon placing a workpiece over the exposed end of the cylindrical member, it is retained on it by the air pressure tending to draw it in to the cylindrical member. Such chucks are presently used, particularly in the photoresist operations, but are individually loaded and unloaded. Using the carrier in accordance with the present invention, a plurality of vacuum chucks are disposed in a pattern of the wafer carrier so that the carrier can be inserted over the chucks and the wafers loaded onto the chucks or unloaded from them and transferred to another work station for other operations.

It is apparent that in accordance with the present invention, machinery may be designed to effect the automatic handling of the wafer carriers between work stations much more readily than it is possible to automate handling by a tweezer device.

In use, the wafers are initially disposed within the recesses by manual means such as the previously used tweezer device, or manual vacuum pencil.

Figures 5A, 5B:
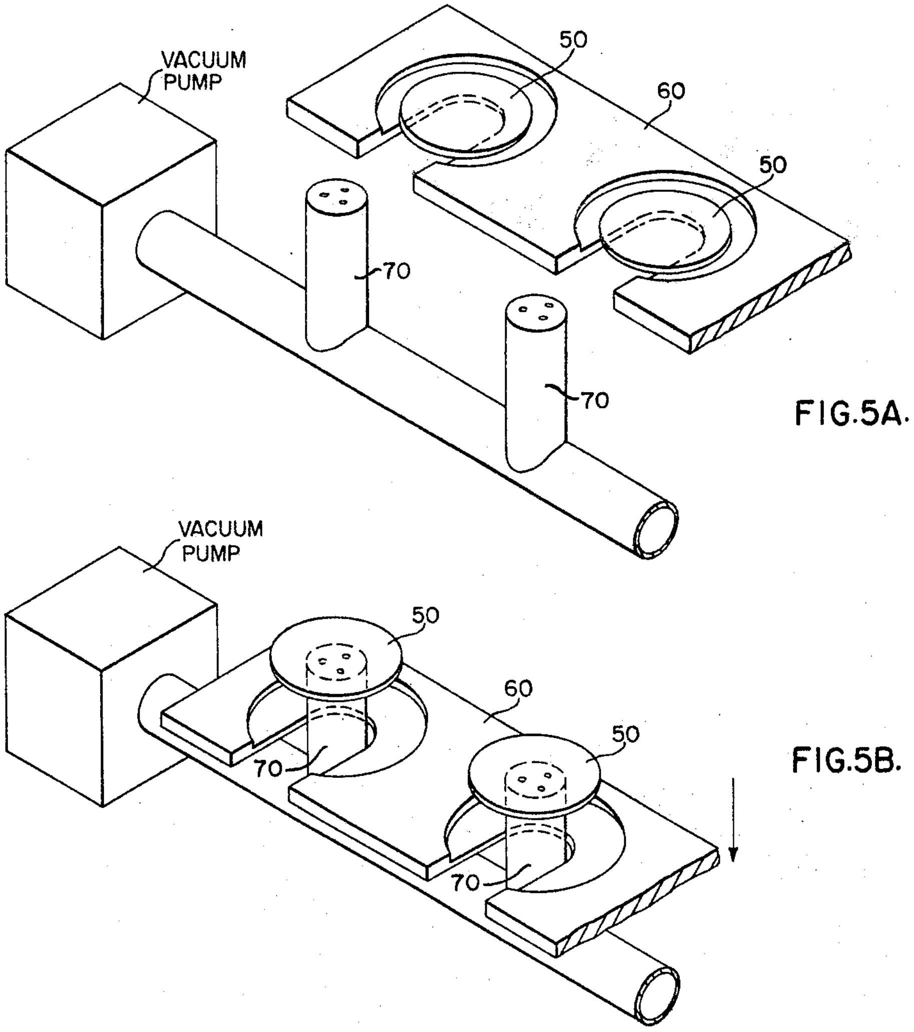
FIGS. 5A to 5C are partial, perspective views of the use of a wafer carrier in accordance with the method of the present invention.
Figure 5C:
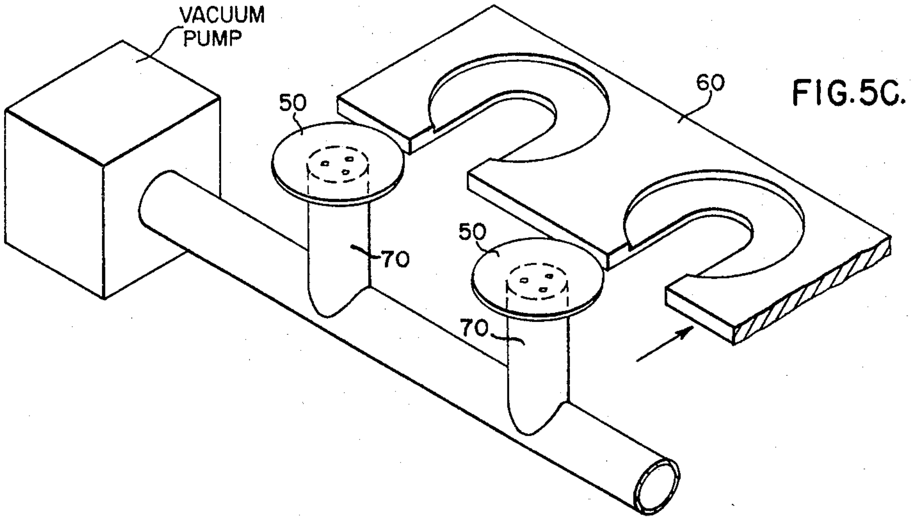

FIG. 5A shows wafers 50 in a carrier 60. A plurality of vacuum chucks 70 corresponding to the recesses in carrier 60 are also shown. The wafers rest in the recesses that hold them in proper location so that they will line up with the centers of the individual vacuum chucks 70 of the vacuum chuck station. The carrier 60 is lowered so that the chucks 70 are brought into contact with the bottom surface of the wafers 50 and the wafers are held thereon, as shown in FIG. 5B, the arrow indicating the direction in which the carrier is moved. Then the carrier is withdrawn, as shown in FIG. 5C. The wafers may be processed in the vacuum chuck station and then, by a reverse procedure, loaded onto the carrier and transferred to another work station.

The wafer carriers eliminate the use of tweezers for handling between operations. This is a great help in reducing damage to wafers and improving overall yield. However, it will be appreciated that there are operations not presently performed on vacuum chucks wherein tweezer handling may be used. For example, where the wafer carrier is of a metal such as anodized aluminum, it is not suitable as a diffusion boat and the wafers must be manually removed to a carrier of quartz or other suitable material for diffusion operations. However, the number of operations in which a carrier in accordance with the present invention may be used, in present conventional manufacturing processes for integrated circuits, is large. The photoresist processes which presently employ vacuum chucks are repeated a minimum of five times during the complete manufacturing process performed on a single wafer and require a minimum of 16 discrete handlings of the wafers with tweezers that are avoided by the method and apparatus of this invention.

Thus the present technique improves upon prior practices by reducing damage from tweezer scratches and contamination. It also provides a more rapid means of handling wafers and of automatically transferring them between work stations. Some operations may be performed on the wafer carriers such as visual inspections and some electrical tests. Mechanization of wafer handling may be achieved. The degree of operator proficiency and training required for the wafer carrier system is greatly reduced from that required for tweezer handling.

While the present invention has been shown and described in a few forms only, it will be apparent that various changes and modifications may be made without departing from the spirit and scope thereof.

We claim as our invention:

1. A wafer carrier for rapidly handling a plurality of semiconductor wafers or the like without breakage or contamination and comprising: a generally flat rigid member having opposed major surfaces and an edge surface; a plurality of recesses in one of said major surfaces for receiving and retaining a like plurality of semiconductor wafers; a plurality of slots through said member each extending from said edge to at least one of said recesses, said slots being mutually parallel for positioning said member about a plurality of vacuum chucks so semiconductor wafers can be transferred between the vacuum chucks and the recesses in said member; said recesses being disposed in a plurality of rows and each of said slots extending from said edge to one of said recesses in each of said rows.

2. Apparatus for the processing of semiconductor devices or the like comprising: a first vacuum chuck station comprising a plurality of generally tubular members and means to draw a vacuum through said tubular members; a second vacuum chuck station comprising a plurality of generally tubular members in the same configuration as that of said first vacuum chuck station and means to draw a vacuum through said tubular members; means for transfer of a plurality of semiconductor wafers between said first and second vacuum chuck stations including a generally flat rigid member having opposed major surfaces and an edge surface; a plurality of recesses in one of said major surfaces in the same configuration as that of said generally tubular members of said vacuum chuck stations for receiving and retaining a like plurality of semiconductor wafers; a plurality of slots through said member each extending from said edge to at least one of said recesses, said slots being mutually parallel for positioning said member about said plurality of generally tubular members of said first and second vacuum chuck stations.

3. Apparatus for the processing of semiconductor devices as defined in claim 2 wherein: said pluralities of generally tubular members in each of said vacuum chuck stations and said plurality of recesses in said wafer magazine are each disposed in a single row.

4. Apparatus for the processing of semiconductor devices as defined in claim 2 wherein: said pluralities of generally tubular members in each of said vacuum chuck stations and said plurality of recesses in said wafer magazine are each disposed in a plurality of rows and each of said slots in said wafer magazine extends to one of said recesses in each of said rows.

5. In a method of processing semiconductor devices, the steps comprising: loading a plurality of semiconductor wafers in a wafer carrier having a plurality of recesses for said wafers and a slot to each of said recesses; transporting said wafer magazine to a first vacuum chuck station of a plurality of vacuum chucks having a configuration like that of said recesses; placing said wafer magazine over said vacuum chucks; lowering said wafer magazine so the bottom surface of said wafers contacts said vacuum chucks; withdrawing said wafer magazine, said vacuum chucks passing through said slots; performing a fabrication operation on said wafers; replacing said wafer magazine around said vacuum chucks; raising said wafer magazine to pick up said wafers from said vacuum chucks and transporting said wafer magazine to a second vacuum chuck station.

6. In a method of processing semiconductor devices, the steps comprising: loading a plurality of semiconductor wafers in a like plurality of recesses in a wafer carrier having slots from one edge to said recesses; positioning said semiconductor wafers on a plurality of vacuum chucks for the performance of a fabrication operation by placing said wafer carrier over said vacuum chucks; lowering said wafer magazine so the bottom surface of each of said wafers contact one of said vacuum chucks; and withdrawing said wafer magazine, said vacuum chucks passing through said slots.

7. In a method of processing semiconductor devices, the steps comprising: removing a plurality of semiconductor wafers from a first vacuum chuck work station and transporting them to a second vacuum chuck work station by obtaining a wafer carrier having a like plurality of recesses and slots from one edge to said recesses; placing said wafer carrier around said first vacuum chuck work station that comprises a like plurality of vacuum chucks; raising said wafer carrier to pick up said wafers from said vacuum chucks; placing said wafer carrier over said second vacuum chuck work station; lowering said wafer carrier so the bottom surface of said wafers contacts said vacuum chucks; withdrawing said wafer carrier, said vacuum chucks passing through said slots.

References Cited by the Examiner

UNITED STATES PATENTS

| | | | |
|---|---|---|---|
| 399,446 | 3/1889 | Stewart | 177—247 |
| 906,677 | 12/1908 | Beasley | 294—32 |
| 2,440,902 | 5/1948 | Lutey | 294—87.28 |
| 2,508,945 | 5/1950 | Heuer | 294—87.28 X |
| 2,654,628 | 10/1953 | Klante | 294—87.28 |

FOREIGN PATENTS

| | | |
|---|---|---|
| 569,584 | 5/1945 | Great Britain. |

MARVIN A. CHAMPION, *Primary Examiner*.